United States Patent

Jakob et al.

[11] Patent Number: 5,982,049
[45] Date of Patent: Nov. 9, 1999

[54] CONTROL MODULE

[75] Inventors: Gert Jakob, Stuttgart; Frank Kurfiss, Muehlacker; Elisabeth Abendroth, Marbach, all of Germany

[73] Assignee: Robert Bosch GmbH, Stuttgart, Germany

[21] Appl. No.: 09/028,925

[22] Filed: Feb. 24, 1998

[30] Foreign Application Priority Data

Feb. 28, 1997 [DE] Germany ............................ 297 03 595

[51] Int. Cl.$^6$ .................................................. H05K 7/20
[52] U.S. Cl. ..................... 307/10.1; 307/9.1; 180/65.8; 361/601; 361/679; 361/728
[58] Field of Search .................................. 307/9.1, 10.1; 477/96, 728, 679; 361/715, 601, 600; 303/119.2; 180/65.8; 174/52.1

[56] References Cited

U.S. PATENT DOCUMENTS

| | | |
|---|---|---|
| 4,218,724 | 8/1980 | Kaufman . |
| 5,132,877 | 7/1992 | Branan et al. . |
| 5,578,803 | 11/1996 | Andersson et al. ..................... 200/5 R |
| 5,737,188 | 4/1998 | Fierl et al. .............................. 361/715 |
| 5,755,494 | 5/1998 | Sekiguchi ............................. 303/119.2 |
| 5,759,132 | 6/1998 | Osborn et al. ............................ 477/96 |

FOREIGN PATENT DOCUMENTS 0 714 228   5/1996   European Pat. Off. .

*Primary Examiner*—Albert W. Paladini
*Attorney, Agent, or Firm*—Kenyon & Kenyon

[57] ABSTRACT

A control module, in particular for a control circuit in a motor vehicle, is configured in such a way that it can be produced economically. The control module has a two-part housing which includes a lower part and an upper part. The lower part is configured as a plate, having a connector member for a downstream device, which can be joined flat to a circuit board. The circuit board is populated on a front side with components which can be soldered with the reflow method to connector parts of the circuit board. The upper part, which is configured as a cover, has an opening to receive a plug connector, and can be snap-locked onto the plate. The control module is preferably used in automobile engineering.

6 Claims, 2 Drawing Sheets

CONTROL MODULE

FIELD OF THE INVENTION

The present invention relates to a control module, in particular for a control circuit in a motor vehicle.

BACKGROUND INFORMATION

In the case of a known control module, a stamped grid is used as a component support in a two-part housing that contains on an upper part a receptacle for a plug connector, and on a lower part contact elements for electrical connection to a downstream device.

The lower part is configured in a box shape, such that the side walls, proceeding from an upper side of the lower part, are locally interrupted. The side walls serve as positioning means on the one hand for the upper part and on the other hand for the stamped grid with its surround.

The components mounted on the stamped grid are to be electrically connected to the connection points configured in the stamped grid. If circuit modifications are to be made to the control module, however, this is difficult to implement due to the predefinition of the connection points, and may possibly be achievable only by means of a redesigned punched grid. In addition, mounting of the components on the punched grid is limited, and it is difficult to link the terminals of the components to one another, so that production of the control module is complex and cost-intensive, especially if it comprises many functions.

SUMMARY OF THE INVENTION

The control module according to the present invention has the advantage that the aforementioned shortcoming is eliminated to a satisfactory degree. For this purpose, the control module has as the lower part of the housing a plate, and as the component support a circuit board, on which mounting of components and linkage of the pertinent terminals can be easily accomplished. Moreover the circuit board is also, without surrounding side walls, freely accessible after mounting on the plate, so that the electrical connections of the component terminals to the connection points on the circuit board can be made quickly and reliably. This allows the control module to be produced easily and economically.

DETAILED DESCRIPTION

Figure 1:
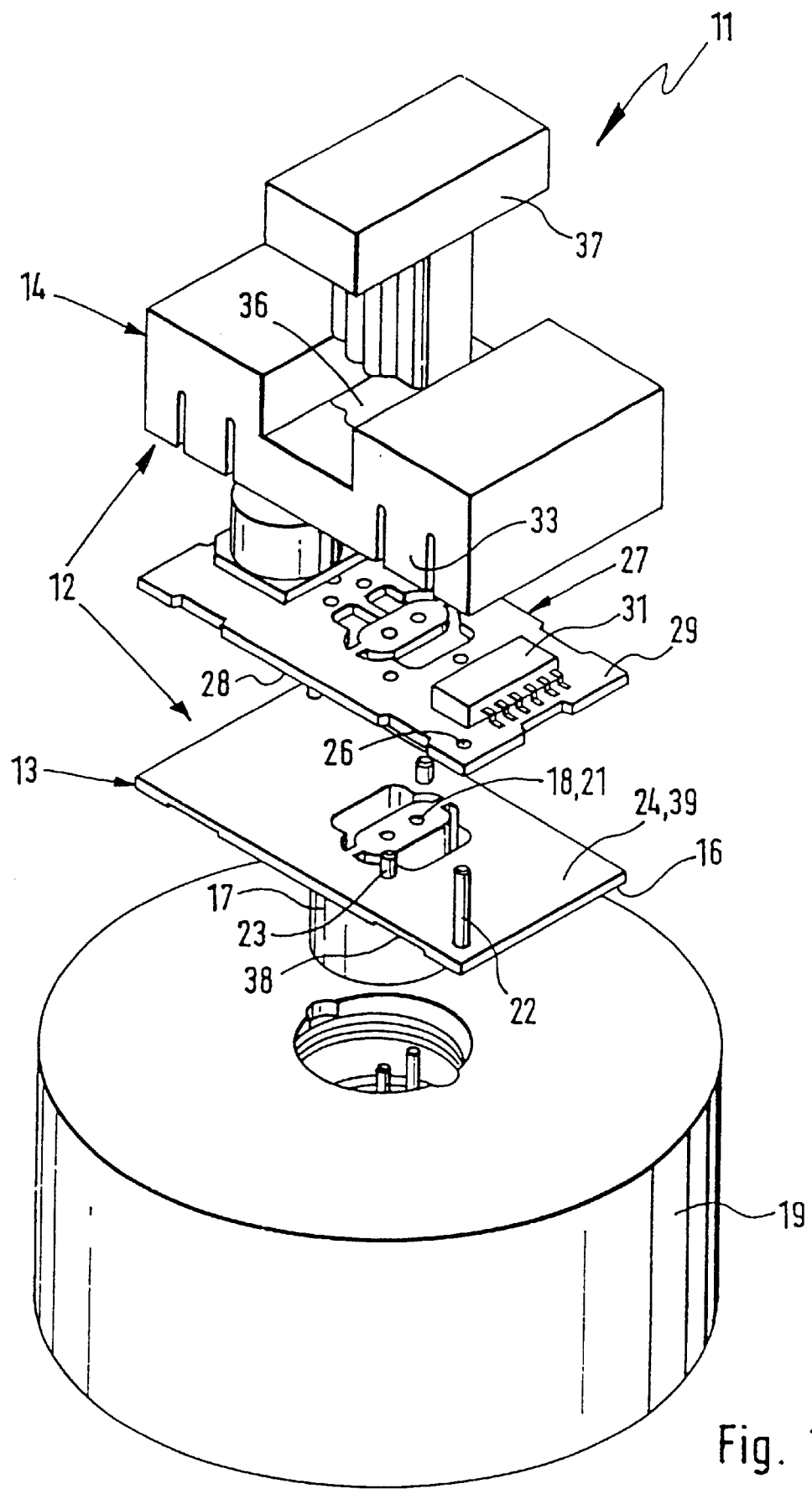
FIG. 1 depicts the control module in an exploded, perspective view.
Figure 4:
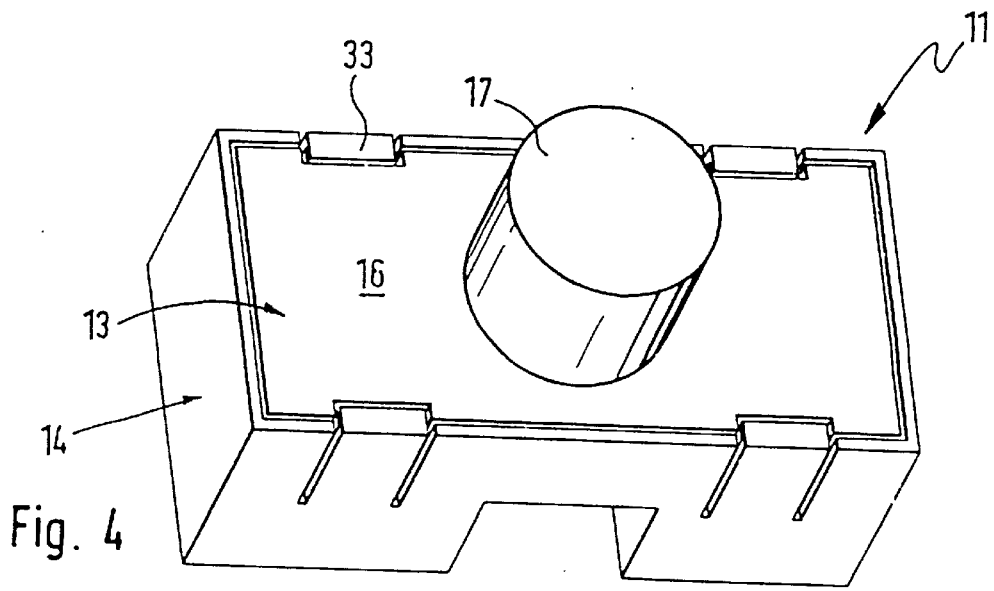
FIG. 4 shows the assembled control module, also in a perspective view from below.

A control module 11, in particular for a control circuit in a motor vehicle, has as shown in FIG. 4 a housing 12 made of plastic, which as shown in FIG. 1 includes a lower part in the form of a plate 13 and an upper part in the form of a cover 14.

Mounted on underside 16 of plate 13 is a cylindrical connector member 17 with contact elements 18 for electrical connection of the control module 11 to a downstream device 19, for example to an igniter.

Contact elements 18 project out of an upper side 24 of plate 13 with connector sections 21 and with pin-shaped positioning means 22 and stud-shaped first snap elements 23.

Figure 2:
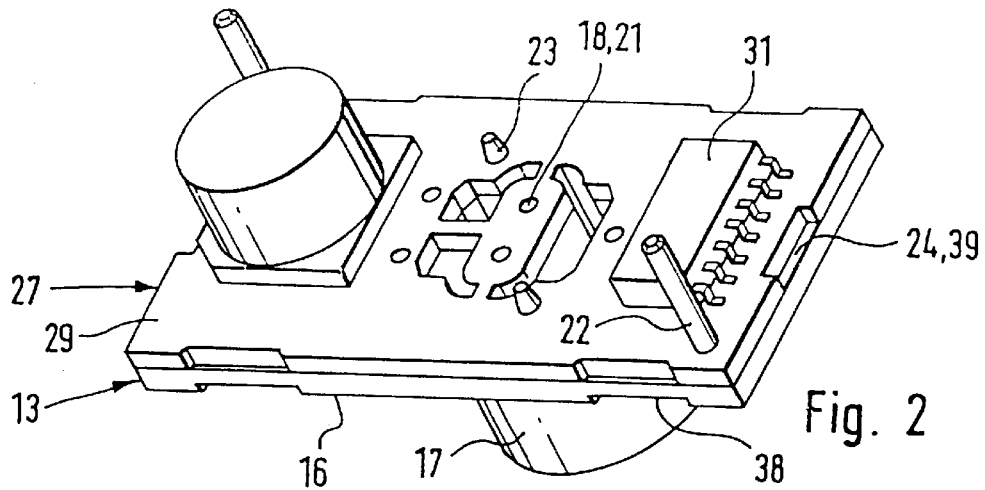
FIG. 2 shows a perspective view of a lower part of the housing of the control module joined to a circuit board of the control module.

After positioning means 22 have been passed, with first snap elements 23 and contact sections 21, through orifice 26 of a component support configured as circuit board 27, plate 13 can be laid with its otherwise flat upper side 24 against a back side 27 of circuit board 27, and secured by means of first snap elements 23, as depicted in FIG. 2.

Circuit board 27 is populated on front side 29, which is equipped with soldering paste, with components 31, for example with surface-mounted components 31 using the SMD technique. In addition, as already mentioned previously, connector sections 21 of contact elements 18 project out at front side 29. Since circuit board 27, placed on the flat plate 13, has no plastic surrounds, components 31 and connector sections 21 can, in a manner that is favorable in terms of production engineering, be soldered directly to connection points or conductor paths of circuit board 27 by means of reflow soldering, in which the heat input which melts the solder is provided, for example, by means of radiation.

Figure 3:
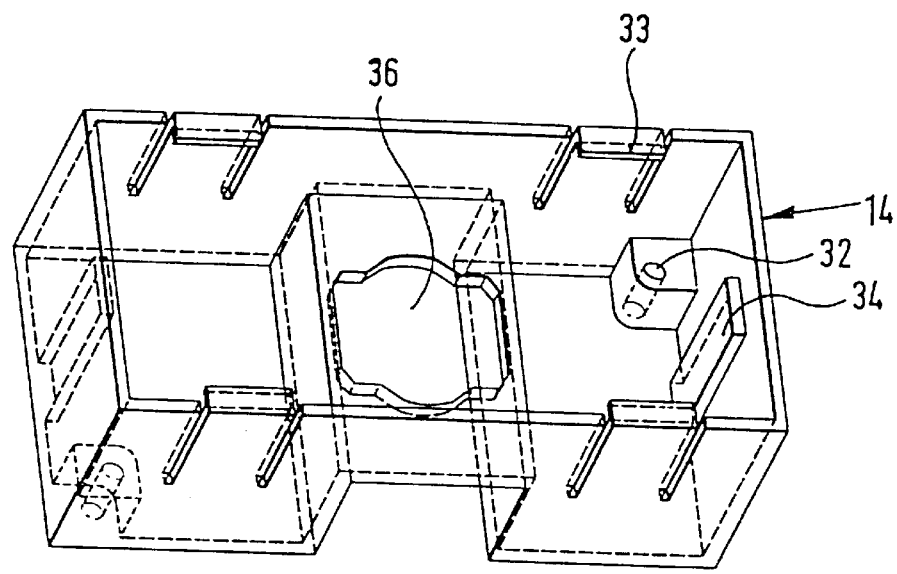
FIG. 3 shows an upper part of the housing of the control module in a perspective view from below.

Cover 14 depicted in FIG. 3 can be placed onto this composite assembly. Cover 14 has holes 32 to receive positioning means 22, as well as tab-shaped outwardly deflectable second snap elements 33 and support elements 34, and an opening 36 to receive a plug connector 37 as depicted in FIG. 1, which makes electrical contact on circuit board 27 in a manner not shown in further detail. When cover 14 is placed onto plate 13 equipped with circuit board 27, cover 14 is guided by means of holes 32 and positioning means 22 and arrives in a final position as shown in FIG. 4, joined by means of a snap-lock join of second snap elements 33 to snap shoulders 38, depicted in FIG. 2, of plate 13, such that support elements 34 of cover 14 come into contact, as countermembers, against support surfaces 39 of plate 13.

A control module 11 configured and assembled in this fashion is easy to manufacture in its parts and easy to PCT together, so that it can be produced economically.

What is claimed is:

1. A control module comprising:
   a component support including a circuit board; and
   a housing including a lower part and an upper part, at least one contact element provided on the lower part, a connector member provided on the lower part, a receptacle provided on the upper part, the at least one contact element for establishing an electrical connection to a downstream device, the receptacle for receiving a plug connector, the lower part including a positioning member for positioning the component support with respect to at least the lower part, the lower part further including a plate, the connector member being joined onto the at least one contact element on the plate.

2. The control module according to claim 1, wherein the control module is for a control circuit of a motor vehicle.

3. The control module according to claim 1, wherein the connector member is attached to an underside of the plate, and the positioning member and a connector section of the at least one contact element guided through the plate are attached to an upper side of the plate.

4. The control module according to claim 3, wherein the positioning member and the connector section pass through orifices of the circuit board, and the plate lays flat against a back side of the circuit board and is secured to the circuit board via first snap elements.

5. The control module according to claim 4, wherein a front side of the circuit board carries components, the components being soldered together with the connector section to at least one of connection points and conductor paths of the circuit board.

6. The control module according to claim 5, wherein the upper part of the housing is secured to at least one support surface of the plate, second snap elements of the upper part being secured to connection shoulders of the plate.

* * * * *